United States Patent
Izumida et al.

(10) Patent No.: US 6,701,611 B1
(45) Date of Patent: Mar. 9, 2004

(54) ELECTRONIC COMPONENT MOUNTING APPARATUS OPERABLE TO MOUNT ELECTRONIC COMPONENTS ONTO A MOUNT OBJECT

(75) Inventors: Keizo Izumida, Yamanashi (JP); Takeshi Takeda, Yamanashi (JP); Kazuyuki Nakano, Yamanashi (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/959,146

(22) PCT Filed: Apr. 21, 2000

(86) PCT No.: PCT/JP00/02617
§ 371 (c)(1),
(2), (4) Date: Oct. 18, 2001

(87) PCT Pub. No.: WO00/65896
PCT Pub. Date: Nov. 2, 2000

(30) Foreign Application Priority Data

Apr. 21, 1999 (JP) .......................................... 11-113560

(51) Int. Cl.$^7$ ................................................ H05K 3/30
(52) U.S. Cl. ............................. 29/832; 29/829; 29/834; 29/836; 29/837
(58) Field of Search .................... 29/832, 739, 741, 29/837, 706, 707, 708, 709, 712, 743, 829, 834, 836, 740, 759, 838; 700/160

(56) References Cited

U.S. PATENT DOCUMENTS

| 4,468,601 | A | | 8/1984 | Chamran et al. | ........... 318/696 |
| 5,305,524 | A | * | 4/1994 | Byeon | .......................... 29/836 |
| 5,313,401 | A | * | 5/1994 | Kasai et al. | ................. 700/160 |
| 5,727,311 | A | * | 3/1998 | Ida et al. | ....................... 29/832 |
| 5,911,456 | A | * | 6/1999 | Tsubouchi et al. | ............ 29/833 |

* cited by examiner

Primary Examiner—Carl J. Arbes
Assistant Examiner—T. Phan
(74) Attorney, Agent, or Firm—Wenderoth, Lind & Ponack, L.L.P.

(57) ABSTRACT

The present invention provides an electronic component mounting apparatus which can reduce a consumption power amount in comparison with the background art, and a power supply control method which is executed by the electronic component mounting apparatus. A drive power source and a control power source are separately connected and shut-off in accordance with a command from a control device to each of component feed drive parts for driving component feed devices, a component transfer drive device for driving a component transfer device, and a circuit board positioning drive device for driving a circuit board positioning device. The control device detects an individual occurrence of halt condition of each of constitution parts of an electronic component mounting apparatus and shuts off the drive power source to the drive device in the halt condition. Thus, a wasteful power consumption is eliminated and the production is continued with a necessary minimum power.

9 Claims, 7 Drawing Sheets

Fig. 5
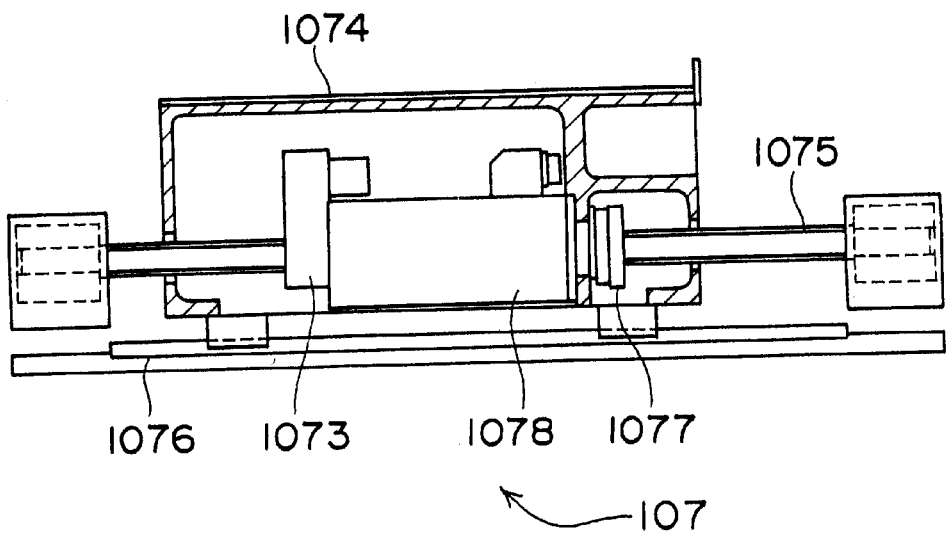
Fig. 6
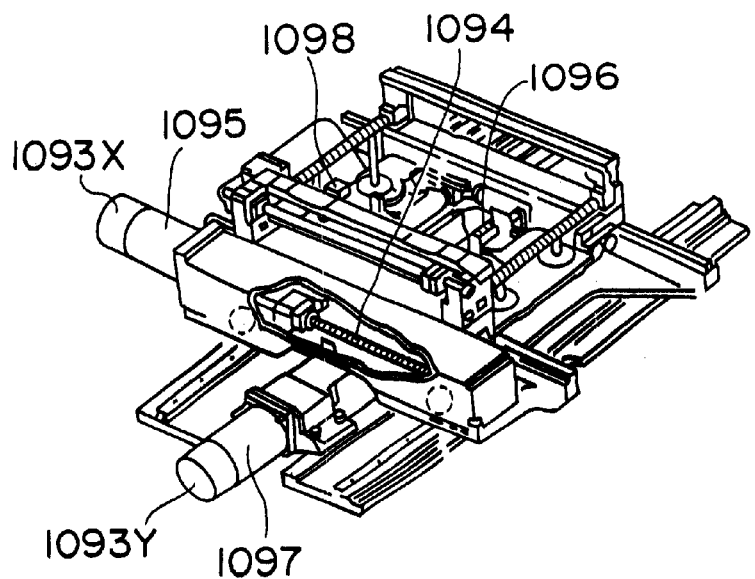
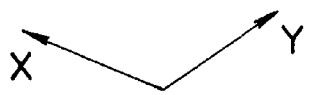

ELECTRONIC COMPONENT MOUNTING APPARATUS OPERABLE TO MOUNT ELECTRONIC COMPONENTS ONTO A MOUNT OBJECT

CROSS REFERENCE TO RELATED DOCUMENT

The present application is a 371 Application No. PCT/JP00/02617, filed Oct. 18, 2001, which claims the benefit of Japanese Patent Application No. 11-113560, filed Apr. 21, 1999.

TECHNICAL FIELD

The present invention relates to an electronic component mounting apparatus for mounting electronic components to mount positions on objects to be mounted such a as circuit boards or the like, and a power supply control method executed by the electronic component mounting apparatus.

BACKGROUND ART

FIG. 7 illustrates a conventional electronic component mounting apparatus 50. The electronic component mounting apparatus 50 roughly comprises component feed devices 1A, 1B for supplying electronic components to be mounted to a circuit board 5; a component transfer device 2 of a rotary type for holding the electronic components from the component feed device 1A or component feed device 1B and mounting onto the circuit board 5; a circuit board positioning device 3 for moving the circuit board 5 so that a mount position on the circuit board 5 is positioned at a component hold release position o f the component transfer device 2; and a control device 4 for controlling these component feed devices 1A, 1B, the component transfer device 2, and the circuit board positioning device 3 in association with each other. The component feed devices 1A, 1B are driven by component feed drive devices 7A, 7B respectively, the component transfer device 2 is driven by a component transfer drive device 8, and the circuit board positioning device 3 is driven by a circuit board positioning drive device 9. In the electronic component mounting apparatus 50 of the constitution, as indicated in FIG. 8, a power source to the component feed devices 1A, 1B, the component transfer device 2, the circuit board positioning device 3, and the control device 4 is connected, shut off by a power source panel 6 and a source connection circuit incorporated in the panel via the component feed drive devices 7A, 7B, the component transfer drive device 8, and the circuit board positioning drive device 9 respectively.

The connection and shut-off of the power source are generally carried out in an order shown in flow charts of FIG. 9. The power source is connected when the electronic component mounting apparatus 50 is in use, and disconnected when the electronic component mounting apparatus 50 is finished to be used at termination of a sequence of production operations or on the occasion of maintenance. In some of the electronic component mounting apparatuses, all or part of the component feed devices are adapted to supplement components during the production with an aim for a long-time production, and in this case the power source is disconnected to the drive device for the component feed device to which the components are supplemented. This is generally intended to secure safety of workers handling the electronic component mounting apparatus.

Meanwhile, saving resources and energy has become an issue to be tackled in each of industrial fields from a viewpoint of protecting the earth's environment. Thus, in the electronic component mounting apparatus, cut back of power consumption of entire facilities or per unit production amount is grappled. On the other hand, an improvement in production capacity per unit time is demanded to the electronic component mounting apparatus, which leads to an increase of a current consumed at each of drive device. In general, while an operation speed of each drive device is unavoidably raised so as to increase the production capacity per unit time, this requires to make a construction including the drive device light in weight and increase a capacity of an electric motor or the like used in the drive device. The power consumption increases in accordance with the increase in capacity of the electric motor, etc., so, the aim of improving the production capacity and saving energy contradict each other.

DISCLOSURE OF INVENTION

The present invention is devised to solve the problem and an object of the present invention is to provide an electronic component mounting apparatus and a method executed by the electronic component mounting apparatus for controlling power supply whereby a consumption power amount can be reduced as compared with the background art.

In accomplishing these and other aspects, according to a first aspect of the present invention, there is provided an electronic component mounting apparatus, which comprises:

a component feed device for supplying electronic components to be mounted on a mount object which has a drive power source device for the feed device for supplying a driving electric power for the component feed device and a control power source device for the feed device for supplying an operation control electric power for the component feed device;

a component transfer device for holding the electronic components from the component feed device and mounting onto the mount object which has a drive power source device for the transfer device for supplying a driving electric power for the component transfer device and a control power source device for the transfer device for supplying an operation control electric power for the component transfer device; and a control device for controlling operations of the component feed device and component transfer device, wherein based on a detection of the control device that the electronic component mounting apparatus is at a halt in an operation because of the other reason than a shutoff of power supply to the electronic component mounting apparatus, in at least one of the drive power source devices for the feed device and the transfer device of the component feed device, the control device shuts off the power supply to the drive power source device thereof while maintaining the power supply to the control power source device thereof.

In the first aspect, the halt condition detected by the control device may result from a maintenance work to the electronic component mounting apparatus, a component shortage at the component feed device, a wait mode for the mount object to be carried to the electronic component mounting apparatus, or an operation failure in at least one of the component feed device and the component transfer device.

In the first aspect, in the wait mode for the mount object, based on a cancel of the wait mode, the control device may resume the operations of the component feed device and component transfer device without a judgment by a worker.

In the first aspect, the control device may detect the halt condition based on output information from encoders equipped at the component feed device and the component transfer device.

According to a second aspect of the present invention, there is provided a power supply control method carried out by an electronic component mounting apparatus which mounts electronic components (111) on a mount object (105), the power supply control method comprising:

detecting an operation halt condition because of the other reason than a shutoff of power supply to the electronic component mounting apparatus; and after the detection, shutting off a supply of a driving electric power to a part in the operation halt condition constituting the electronic component mounting apparatus while a supply of an operation control electric power is maintained to the part of the electronic component mounting apparatus.

In the electronic component mounting apparatus according to the first aspect of the present invention and in the method for controlling the power supply according to the second aspect of the present invention, the control device is arranged in the electronic component mounting apparatus and detects the drive device which stops operating because of some other reason than the shutoff of the power supply to the electronic component mounting apparatus. The control device shuts off the power supply for driving the drive device while maintaining the power supply for controlling the operation of the drive device to the stopping drive device of the electronic component mounting apparatus. Since the drive power source is shut off to the stopping drive device, wasteful power consumption is eliminated and the production is continued with the necessary minimum amount of power.

BRIEF DESCRIPTION OF DRAWINGS

These and other aspects and features of the present invention will become clear from the following description taken in conjunction with the preferred embodiments thereof with reference to the accompanying drawings, in which:

FIG. 5 is a diagram showing the structure of a component feed drive device shown in FIG. 1;

FIG. 6 is a perspective view showing the structure of a circuit board positioning drive device of FIG. 1;

BEST MODE FOR CARRYING OUT THE INVENTION

Figure 1:
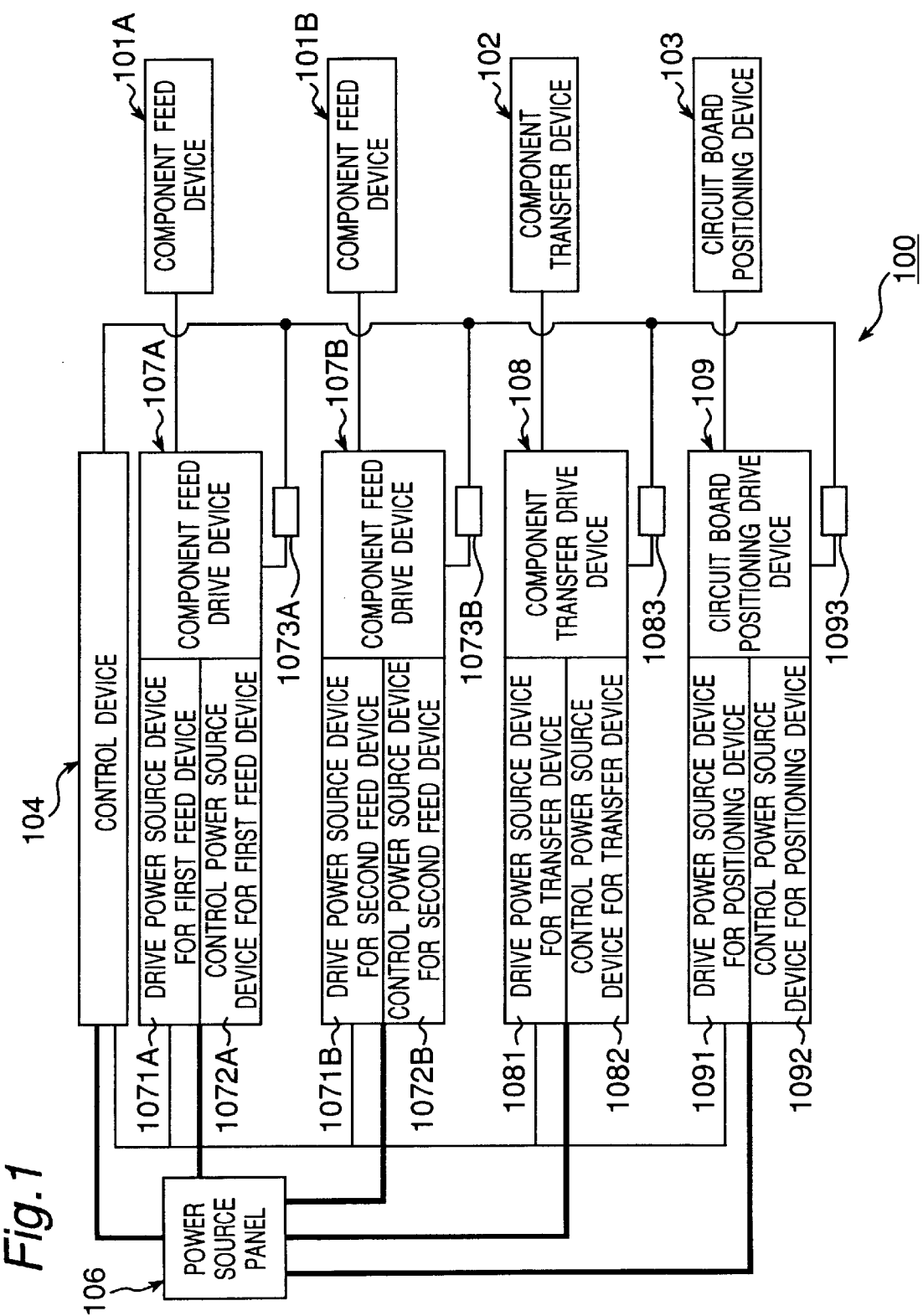
FIG. 1 is a schematic diagram showing a control system in which a control device set to an electronic component mounting apparatus according to an embodiment of the present invention connects, shuts off a power source to each drive device.

An electronic component mounting apparatus which is an embodiment of the present invention and a power supply control method executed by the electronic component mounting apparatus will be described below with reference to the drawings. The same parts are designated by the same reference numerals throughout the drawings.

An example functioning as an "object to be mounted" described in the foregoing "Disclosure Of Invention" corresponds to a circuit board in the embodiment. However, the object to be mounted is not restricted to this and covers conceptually circuit boards or the like having, for example, a liquid crystal display part.

FIG. 1 shows an electronic component mounting apparatus 100 according to the embodiment. The electronic component mounting apparatus 100 roughly comprises component feed devices 101A, 101B movable in an X direction for supplying electronic components 111 to be mounted to a circuit board 105; a rotary type component transfer device 102 for holding the electronic components 111 from the component feed device 101A or component feed device 101B and mounting the held electronic components 111 on the circuit board 105; a circuit board positioning device 103 for moving the circuit board 105 in X, Y directions orthogonal to each other so that a mount position on the circuit board 105 is positioned at a component hold release position of the component transfer device 102; and a control device 104 for controlling the component feed devices 101A, 101B, the component transfer device 102, and the circuit board positioning device 103 in association with each other.

The component feed devices 101A, 101B are driven by component feed drive devices 107A, 107B, the component transfer device 102 is driven by a component transfer drive device 108, and the circuit board positioning device 103 is driven by a circuit board positioning drive device 109.

Since the electronic component mounting apparatus 100 has two component feed devices 101A, 101B as above, a component mount operation is continued with the use of electronic components 111 present in one of the component feed devices even if the other component feed device becomes short of the components.

The component transfer device 102 takes out predetermined electronic components 111 from the component feed device 101A or component feed device 101B in response to a command of the control device 104 and transfers the electronic components 111 to the circuit board placed at the circuit board positioning device 103. During the time after the electronic components 111 are taken out before the electronic components are transferred onto the circuit board, hold states or hold postures of the electronic components 111 by the component transfer device 102 are detected with the utilization of a sensor or an image recognition device. The component transfer device corrects the hold postures of the electronic components 111 on the basis of the detected information, so that the electronic components are correctly mounted on the electronic circuit board.

Each of the component feed drive devices 107A, 107B is constructed in a constitution as shown in FIG. 5. The component feed drive device 107A will be discussed by way of example, but the same description is applied to the component feed drive device 107B. The component feed drive device 107A includes a table 1074 where the component feed device 101A is loaded, a ball screw 1075 extending in the X direction, and a linear guide 1076 extending in the X direction for guiding a movement of the table. The table 1074 has a nut 1077 which is engaged with the ball screw 1075 and to which a hollow motor 1078 and an encoder 1073 are set into one body. The table is moved in the X direction by the hollow motor 1078 as a driving part. The encoder 1073 which sends a signal indicating a movement amount of the table as an example of a detection device for detecting an operation state of the feed device is connected to the control device 104.

Figure 2:
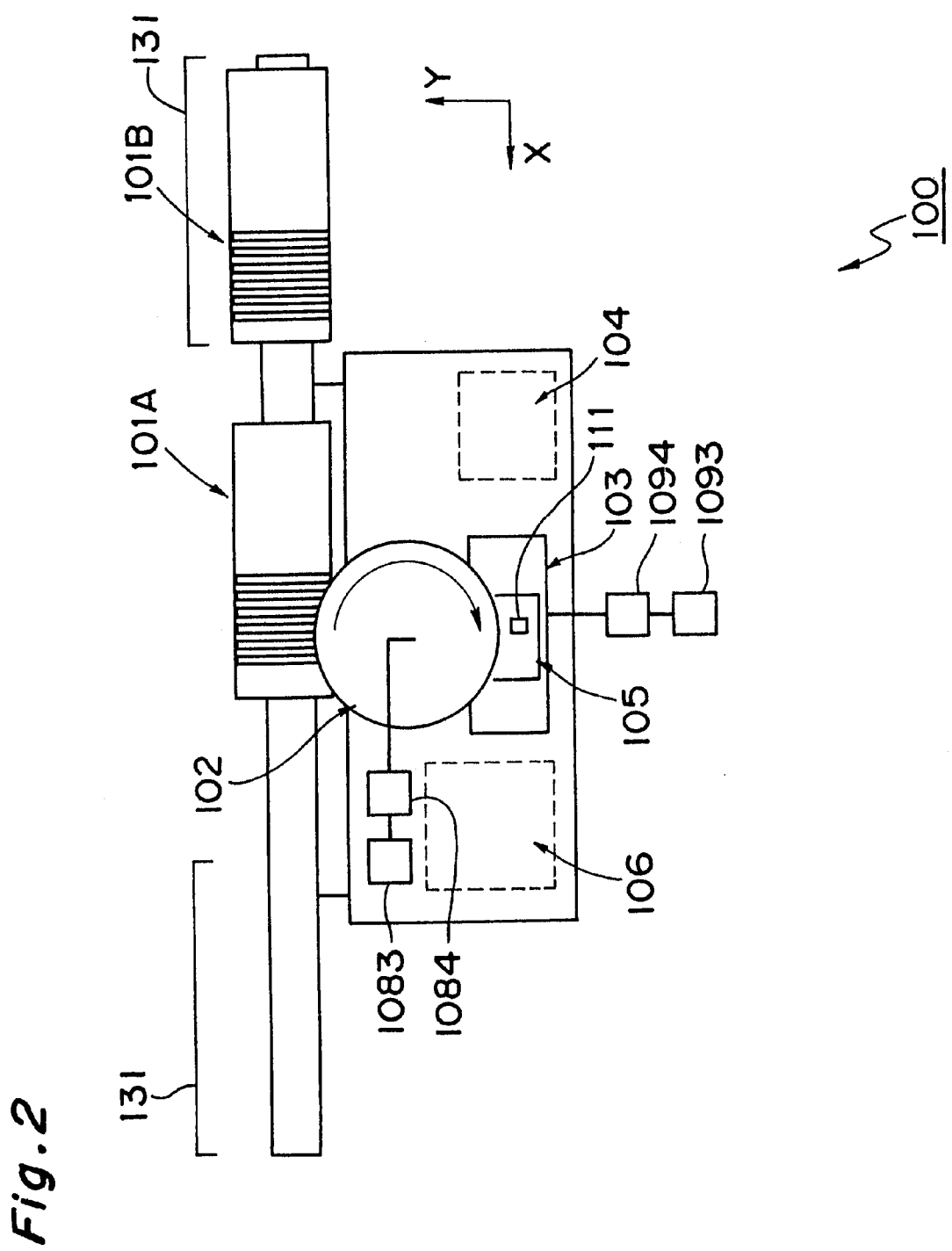
FIG. 2 is a diagram schematically showing the constitution of the electronic component mounting apparatus of the embodiment including the control system of FIG. 1.

The component transfer drive device 108 is a structure, with including a motor 1084 as a driving part for rotating the component transfer device 102 in the clockwise direction shown by an arrow as in FIG. 2 and, an encoder 1083 as an example of a detection device for detecting an operation state of the transfer device and which detects and sends a revolution number of an output shaft of the motor 1084. The encoder 1083 is connected to the control device 104.

As indicated in FIG. 6, the circuit board positioning drive device 109 has a ball screw 1094 extending in the X direction; a motor 1095 as a driving part for rotating the ball screw 1094 in a direction about an axis of the ball screw 1094; an encoder 1093X as an example of a circuit board positioning device operation state detection device for detecting a revolution number of an output shaft of the motor 1095 and sending the revolution number as a movement amount in the X direction; a ball screw 1096 extending in the Y direction; a motor 1097 as a driving part for rotating the ball screw 1096 in a direction about an axis of the ball screw 1096; and an encoder 1093Y as the other example of the circuit board positioning device operation state detection device for detecting a revolution number of an output shaft of the motor 1097 and sending the revolution number as a movement amount in the Y direction. The encoders 1093X, 1093Y are connected to the control device 104.

Each of the component feed drive devices 107A, 107B, the component transfer drive device 108, and the circuit board positioning drive device 109 has a drive power source device for supplying electric power for driving to each of the above drive devices, and a control power source device for supplying electric power for controlling to each of the above drive devices. More specifically, the component feed drive device 107A has a drive power source device 1071A for the first feed device for feeding the electric power to the hollow motor 1078, and a control power source device 1072A for the first feed device. The component feed drive device 107B has a drive power source device 1071B for the second feed device for feeding the electric power to the hollow motor 1078 and a control power source device 1072B for the second feed device. The component transfer drive device 108 has a drive power source device 1081 for the transfer device for feeding the electric power to the motor 1084 and a control power source device 1082 for the transfer device. The circuit board positioning drive device 109 has a drive power source device 1091 for the positioning device for feeding the electric power to the motors 1095, 1097 and a control power source device 1092 for the positioning device.

The reason why the drive power source devices 1071A, 1071B, 1081, 1091, and the control power source devices 1072A, 1072B, 1082, 1092 are set separately is to prevent positioning information on each drive device 107A, 107B, 108, 109 from being lost when the power supply only to the drive power source devices 1071A, 1071B, 1081, 1091 is shut off while the power supply to the control power source devices 1072A, 1072B, 1082, 1092 is maintained, and also to let a control part, etc. operate to prevent a displacement or drop at the feed devices, the transfer device, and/or the positioning device because of its or their own load(s) or the like subsequent to the shutoff of the drive power source.

FIG. 1 depicts the connection for the control from the control device 104 to the drive devices 107A, 107B, 108, 109, component feed devices 101A, 101B, component transfer device 102, and circuit board positioning device 103 via the power source devices, while the other connection is not illustrated to avoid complexity.

The electric power is supplied from a power source panel 106 to each of the drive power source device 1071A for the first feed device, the control power source device 1072A for the first feed device, the drive power source device 1071B for the second feed device, the control power source device 1072B for the second feed device, the drive power source device 1081 for the transfer device, the control power source device 1082 for the transfer device, the drive power source device 1091 for the positioning device and the control power source device 1092 for the positioning device, and the control device 104.

Each of the drive power source device 1071A, the drive power source device 1071B, the drive power source device 1081, and the drive power source device 1091 has a connection-shutoff function to connect, disconnect the power source. The control device 104 controls the power supply to each of the drive power source device 1071A, the drive power source device 1071B, the drive power source device 1081, and the drive power source device 1091 on the basis of output information from the corresponding encoder 1073A, 1073B, 1083, and 1093. This control operation will be detailed later.

In the meantime, the electric power is kept supplied from the power source panel 106 to each of the control power source device 1072A, the control power source device 1072B, the control power source device 1082, and the control power source device 1092 except when the power supply to the electronic component mounting apparatus 100 is shut off.

A method for controlling the power supply to each drive device 107A, 107B, 108, and 109 which is carried out by the control device 104 among other operations in the above-constituted electronic component mounting apparatus 100 will be discussed hereinbelow.

Figure 3:
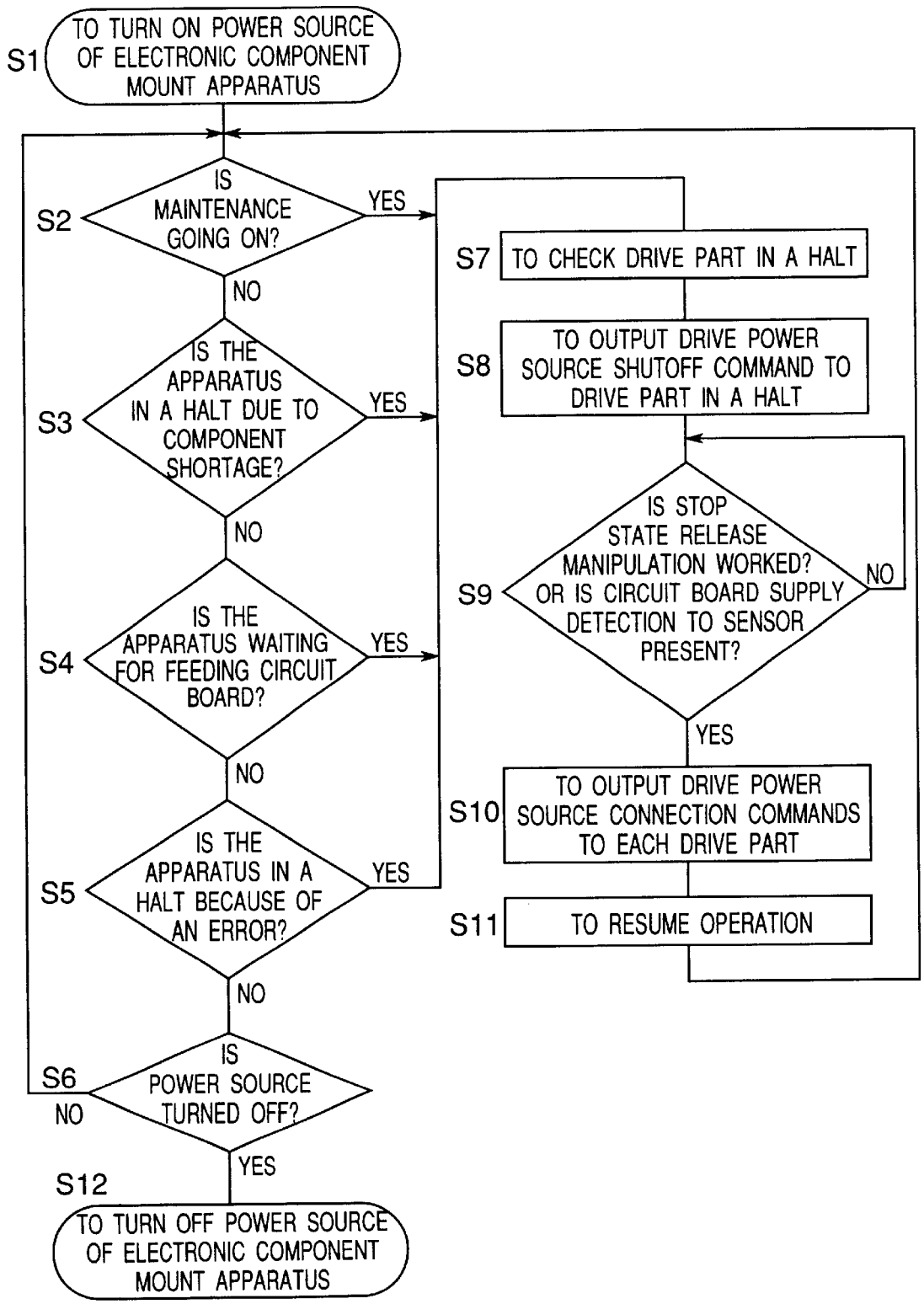
FIG. 3 is a flow chart explaining the operation in a power supply control method executed by the electronic component mounting apparatus of FIG. 2.

In step (designated by "S" in FIG. 3) 1 in FIG. 3, the power source of the electronic component mounting apparatus 100 is turned on. In the state, the control device 104 outputs commands to each of the drive devices 107A, 107B, 108, and 109 to connect the corresponding drive power source device 1071A, 1071B, 1081, and 1091. The control device 104 repeatedly makes judgements in steps 2 through 6 based on signals from the encoders 1073A, 1073B, 1083, and 1093. Operations in these steps will be described herein. A judgment order in the steps 2–6 is not limited to the embodiment and not particularly specified.

In step 2, the control device 104 judges whether the electronic component mounting apparatus 100 is in a maintenance mode such as a check mode or a machine model switch mode or the like. In other words, in the maintenance mode with the power being supplied to the electronic component mounting apparatus 100, when the maintenance work is performed, all oft he component feed devices 101A, 101B, the component transfer device 102, and the circuit board positioning device 103 are at rest. Thus, a stop state signal is sent to the control device 104 from the encoders 1073A, 1073B, 1083, 1093 of the apparatuses. Based on the signals from the encoders 1073A, 1073B, 1083,1093, in step 7, the control device 104judges which of the drive devices stops. In step 8, the control device 104 outputs a power source shutoff command(s) to the corresponding drive power source device(s) for the drive device(s) judged to be in a halt. That is, since the component feed devices 101A, 101B, the component transfer device 102, and the positioning device 103 are all at rest in the maintenance mode, the control device 104 shuts off the power supply to the corresponding drive power source devices 1071A, 1071B, 1081, and 1091.

Upon completion of the maintenance work, following a stop state release operation by the worker in step 9, the control device 104 outputs in step 10 drive power source connection commands to the drive power source devices 1071A, 1071B, 1081, and 1091 to which the power source shutoff commands has been output. The electronic component mounting apparatus 100 is accordingly turned operable in step 11.

In step 3, in the wake of a component shortage at the component feed devices 101A, 101B, the component feed device in short of components moves to stop at a component replenishment position so that electronic components 111 are supplied. In accordance with signals sent from the encoders 1073A, 1073B as described earlier, the control device 104 detects in step 7 which of the two component feed devices 101A, 101B stops. The component feed device 101A is supposed here to be in short of components and at rest. In step 8, the control device 104 outputs the drive power source shutoff command to the drive power source device 1071A which is set to the component drive device 107A of the component feed device 101A at rest. The drive power source device 1071A shuts off the drive power source in response to the drive power source shutoff command. The other drive devices 107B, 108, 109 naturally keep operating at this time.

When the replenishment of electronic components 111 is completed at the component feed device 101A, in step 9, a replenishment completion signal is supplied through the worker's manipulation to the control device 104. The control device 104 memorizes according to the replenishment completion signal that the component feed device 101A is turned in a state to be operable. Simultaneously with the storage, the control device 104 judges that the stop state of the component feed device 101A is freed, with outputting in step 10 the drive power source connection command to the drive power source device 1071A for the first feed device. In consequence, the component feed device 101A is returned to a production operation in step 11.

On the occurrence of a wait condition in a feeding of the circuit boards, since each drive device 107A, 107B, 108, and 109 is in a halt, the control device 104 checks the stopping drive devices in step 7 and outputs the drive power source shutoff commands to each drive power source device 1071A, 1071B, 1081, 1091 in step 8. Although the electronic component mounting apparatus 100 is brought to a halt by the worker at the foregoing maintenance work, the electronic component mounting apparatus 100 is stopped on the basis of a judgment by the control device 104 in the above circuit board wait condition. Therefore, the electronic component mounting apparatus is restarted on the basis of the judgment by the control device 104, not the judgment by the worker.

In step 9, when the circuit board wait condition is relieved as a result of the supply of circuit boards or the like, the control device 104 detects from a circuit board feed detection sensor 1098 equipped in the circuit board positioning drive device 109 that the circuit board wait state is relieved. The control device outputs in step 10 the drive power source connection commands to each drive power source device 1071A, 1071B, 1081, and 1091 to which the drive power source shutoff commands have been output, whereby the production is started again in step 11.

If any operation abnormality takes place in the electronic component mounting apparatus 100 as in step 5, each drive device 107A, 107B, 108, and 109 brought to a stop. Thus, the control device 104 checks the stopping drive devices in step 7 and sends the drive power source shutoff commands to each drive power source device 1071A, 1071B, 1081, and 1091 in step 8. Such the operation stop because of some operation abnormality is also performed on the basis of the judgment by the control device 104. However, the operation is resumed by the worker's judgment, which is a difference from the above-discussed circuit board wait condition.

In step 9, in response to the worker's manipulation to relieve the operation abnormality state, the control device 104 outputs the drive power source connection commands to each of the drive power source devices 1071A, 1071B, 1081, and 1091 to which the drive power source shutoff commands have been output. The production is resumed in step 11.

When the control device 104 detects the shutoff of the power supply to the electronic component mounting apparatus 100 in step 6, the control device 104 generates the power source shutoff commands to each drive power source device 1071A, 1071B, 1081, and 1091. In addition to the shutoff commands by the control device 104, the power source panel 106 works at the same time to shut off the power source, thus realizing an emergency stop function.

In the electronic component mounting apparatus 100 according to the embodiment as above, the control device 104 recognizes the drive device in a halt on the basis of the output signal from at least one of the encoders 1073A, 1073B, 1083, and 1093 in various types of stop states brought about during the operation of the electronic component mounting apparatus 100. As a consequence, the control device 104 makes drive power source device of the drive device in a halt stop to supply the electric power to the drive part corresponding to the drive device in the halt. Therefore, the power not used for the production is prevented from being consumed wastefully. A consumption amount of power at the electronic component mounting apparatus 100 is reduced accordingly and the production is continued with a necessary minimum power.

Figure 4:
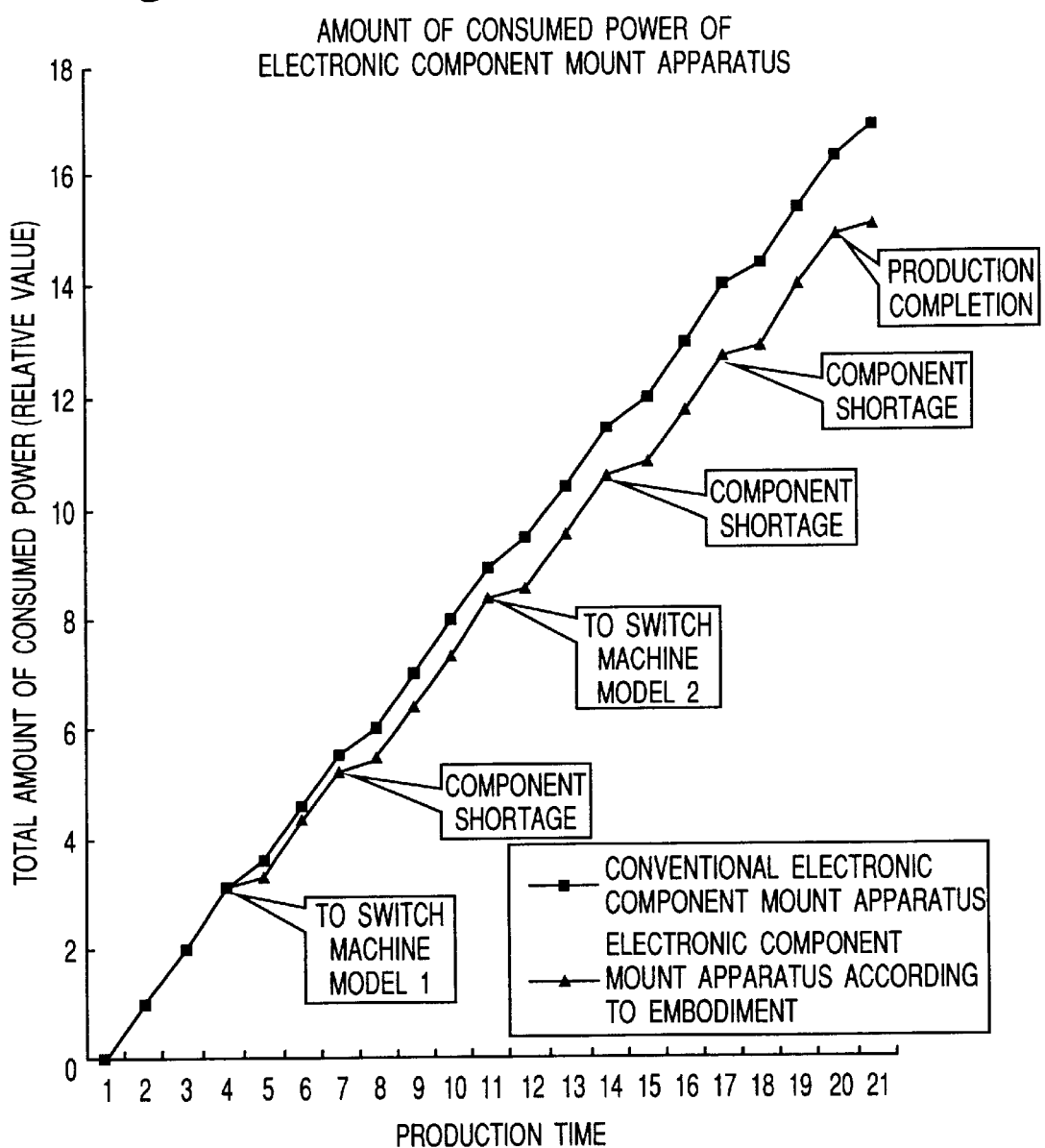
FIG. 4 is a conceptional graph indicating a change in power consumption amount of the electronic component mounting apparatus of FIG. 2 and a conventional electronic component mounting apparatus.
Figure 7:
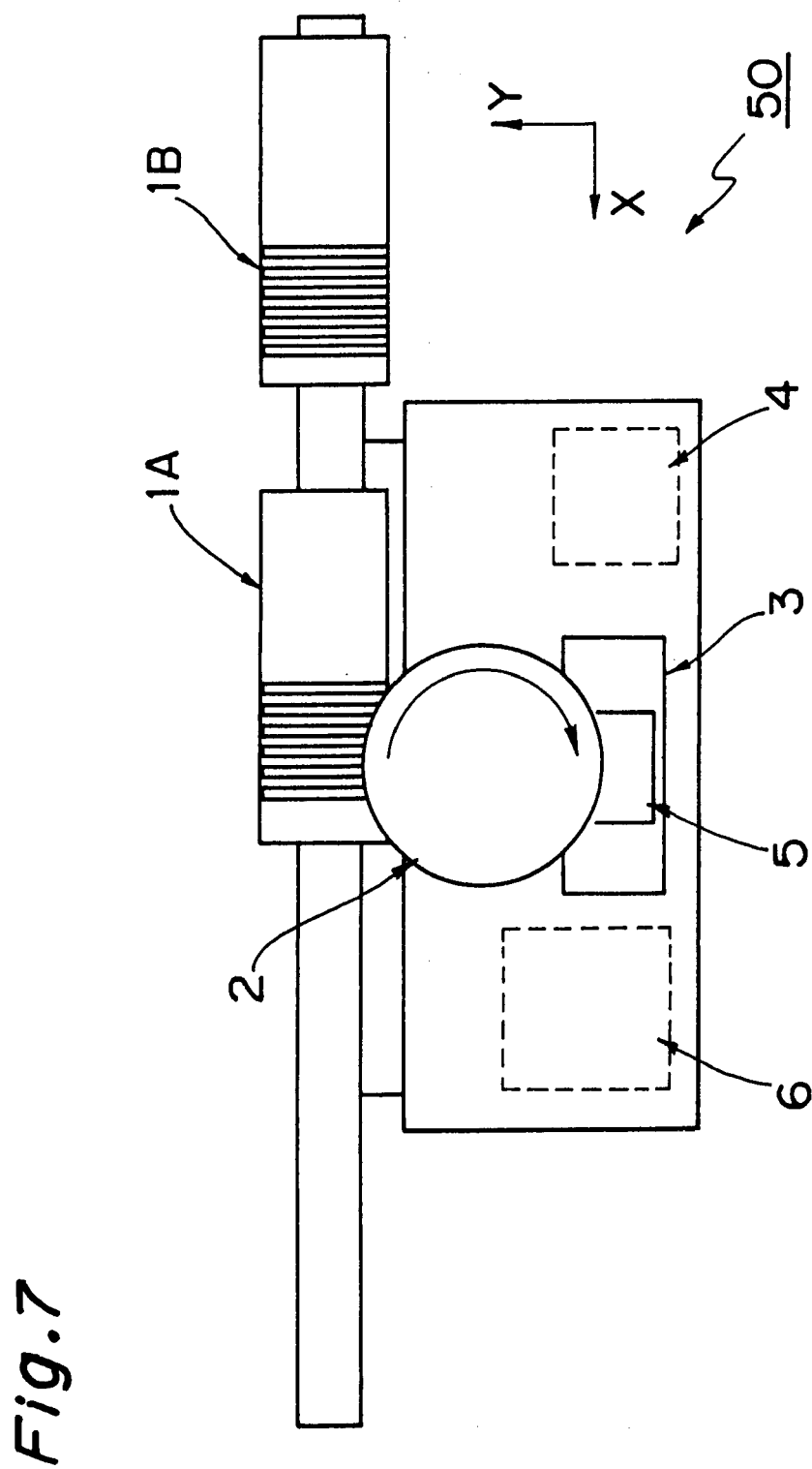
FIG. 7 is a schematic diagram of the constitution of a conventional electronic component mounting apparatus.
Figure 8:
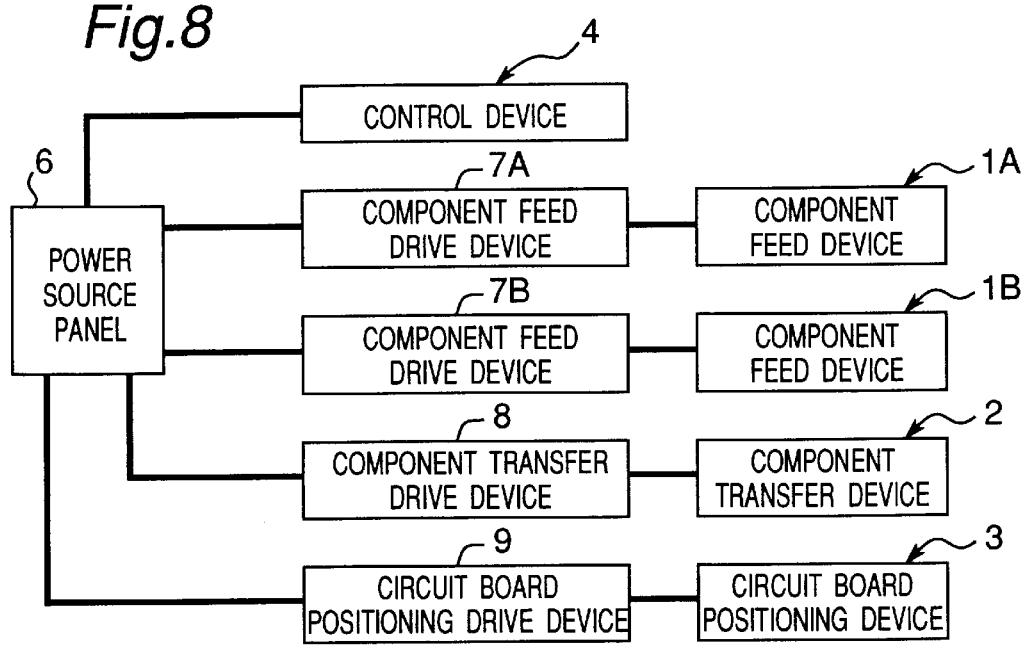
FIG. 8 is a schematic diagram of a control system in the conventional electronic component mounting apparatus of FIG. 7.
Figure 9:
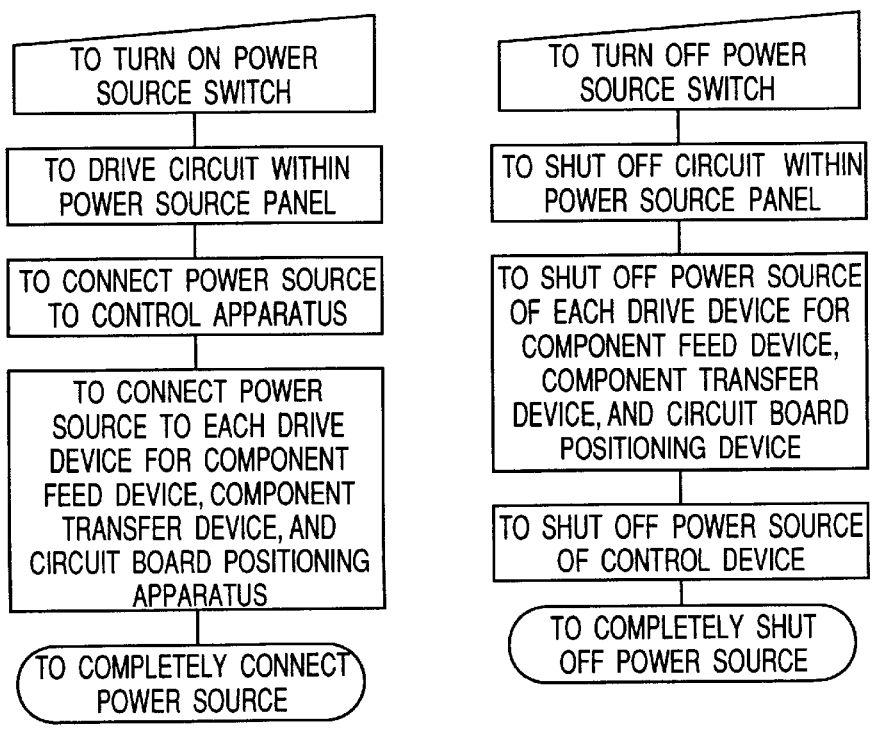
FIG. 9 is flow chart explaining the operation at the connection, shutoff times of a power source in the conventional electronic component mounting apparatus of FIG. 7.

More specifically, each of changes of total amounts of the consumed power in each of the electronic component mounting apparatus 100 and a conventional electronic component mounting apparatus is shown in a graph in FIG. 4. As is clear from the graph, although the consumption amount at the normal operation is equal between the apparatuses, the electronic component mounting apparatus 100 consumes less power as compared with the conventional electronic component mounting apparatus, for example, in the event that a stop state such as the component shortage or the like is occurred. Accordingly, the larger the number of the stop state becomes, the more the sum of the consumed power is reduced in the electronic component mounting apparatus 100 than in the conventional electronic component mounting apparatus.

Further, since the control device 104 orders the power source connection and shutoff, it eliminates particularly complicate procedures from the worker and surely saves energy. Moreover, since the drive power source is shut off to the drive device in a halt, the worker's safety in handling the drive device in a halt is enhanced in comparison with the background art.

In the present embodiment, the connection and disconnection to the drive power source device 1071A, 1071B, 1081, 1091 for the drive device 107A, 107B, 108, 109 is realized at the drive power source device 1071A, 1071B, 1081, 1091. However, the function may be incorporated in the power source panel 106.

When the drive power source device 1071A, 1071B, 1081, 1091 is to be connected to the power source, a wait time is required in some cases before the power source is turned to a stable operation state. For avoiding this inconvenience, the control device 104 may be provided with a constant wait mode at the connection time of the power source or, the power source panel 106 may be equipped with a notification function of informing that the power source is turned in the stable operation state.

Although the so-called rotary type electronic component mounting apparatus 100 is described by way of example in the foregoing embodiment, the present invention is not limited to this type and is applicable to a robot type machine in which a transfer device which corresponds to the component transfer device 102 for holding and transferring the electronic components 111 can move in the X, Y directions.

The entire disclosure of Japanese Patent Application No. 11-113560 filed on Apr. 21, 1999, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting apparatus operable to mount electronic components onto a mount object, said electronic component mounting apparatus comprising:

a component feed device operable to supply the electronic components, said component feed device having a first drive power source device operable to supply a driving electric power for said component feed device and a first control power source device operable to supply an operation control electric power for said component feed device;

a component transfer device operable to obtain the electronic components from said component feed device and to mount the obtained electronic components onto the mount object, said component transfer device having a second drive power source device operable to supply a driving electric power for said component transfer device and a second control power source device operable to supply an operation control electric power for said component transfer device; and a control device operable to control operations of said component feed device and said component transfer device, wherein said control device is operable to detect whether said electronic component mounting apparatus has halted operation for a reason other than a shutoff of a power supply to said electronic component mounting apparatus, wherein when said control device detects that said electronic component mounting apparatus has halted operation for a reason other than a shutoff of a power supply to said electronic component mounting apparatus, said control device is further operable to shut off a power supply to at least one of said first drive power source device and said second drive power source device while maintaining a power supply to at least one of said first control power source device and said second control power source device.

2. An electronic component mounting apparatus according to claim 1, wherein said control device is further operable to detect that said electronic component mounting apparatus has halted operation as a result of one of maintenance work to said electronic component mounting apparatus, a component shortage of the component feed device, a wait mode for waiting for the mount object to be delivered to said electronic component mounting apparatus, or an operation failure in at least one of said component feed device and said component transfer device.

3. An electronic component mounting apparatus according to claim 2, wherein when said electronic component mounting apparatus is in a wait mode, said control device is further operable to control said component feed device and said component transfer device to resume operation based on a cancel of the wait mode without a judgment by a worker.

4. An electronic component mounting apparatus according to claim 3, further comprising:

an encoder disposed at one of said first component feed device, said second component feed device, said first component transfer device and said second component transfer device, wherein said control device is further operable to detect a halt condition based on output from said encoder.

5. An electronic component mounting apparatus according to claim 3, further comprising:

an encoder disposed at each of said first component feed device, said second component feed device, said first component transfer device and said second component transfer device, wherein said control device is further operable to detect a halt condition based on output from said encoders.

6. An electronic component mounting apparatus according to claim 1, wherein when said control device detects that said electronic component mounting apparatus has halted operation for a reason other than a shutoff of a power supply to said electronic component mounting apparatus, said control device is further operable to shut off a power supply to said first drive power source device and said second drive power source device while maintaining a power supply to said first control power source device and said second control power source device.

7. An electronic component mounting apparatus according to claim 6, wherein when said electronic component mounting apparatus is in a wait mode, said control device is further operable to control at least one of said component feed device and said component transfer device to resume operation of said at least one of said component feed device and said component transfer device based on a cancel of the wait mode without a judgment by a worker.

8. An electronic component mounting apparatus according to claim 7, further comprising:

an encoder disposed at one of said first component feed device, said second component feed device, said first component transfer device and said second component transfer device, wherein said control device is further operable to detect a halt condition based on output from said encoder.

9. An electronic component mounting apparatus according to claim 7, further comprising:

an encoder disposed at each of said first component feed device, said second component feed device, said first component transfer device and said second component transfer device, wherein said control device is further operable to detect a halt condition based on output from said encoders.

* * * * *

UNITED STATES PATENT AND TRADEMARK OFFICE
CERTIFICATE OF CORRECTION

| | |
|---|---|
| PATENT NO. | : 6,701,611 B1 |
| DATED | : March 9, 2004 |
| INVENTOR(S) | : Keizo Izumida et al. |

It is certified that error appears in the above-identified patent and that said Letters Patent is hereby corrected as shown below:

<u>Column 1,</u>
Lines 1-2, please change "PCT/JP00/02617, filed Oct. 18, 2001" to -- PCT/JP00/02617 filed April 21, 2000 --.

Signed and Sealed this

Twenty-fourth Day of August, 2004

JON W. DUDAS
*Director of the United States Patent and Trademark Office*